(12) United States Patent
Holfeld (10) Patent No.: US 8,142,958 B2
(45) Date of Patent: Mar. 27, 2012

(54) EUV MASK AND METHOD FOR REPAIRING AN EUV MASK

(75) Inventor: Christian Holfeld, Dresden (DE)

(73) Assignee: Advanced Mask Technology Center GmbH & Co. KG (DE)

( * ) Notice: Subject to any disclaimer, the term of this patent is extended or adjusted under 35 U.S.C. 154(b) by 379 days.

(21) Appl. No.: 12/143,051

(22) Filed: Jun. 20, 2008

(65) Prior Publication Data

US 2008/0318138 A1 Dec. 25, 2008

(30) Foreign Application Priority Data

Jun. 20, 2007 (DE) .................. 10 2007 028 172

(51) Int. Cl.
*G03F 1/00* (2006.01)
(52) U.S. Cl. ........................ 430/5; 430/311; 430/394
(58) Field of Classification Search .............. 430/5, 311, 430/394
See application file for complete search history.

(56) References Cited

U.S. PATENT DOCUMENTS

| | | | |
|---|---|---|---|
| 5,468,337 A * | 11/1995 | Miyatake ................... | 216/24 |
| 5,521,032 A | 5/1996 | Imai et al. | |
| 6,235,434 B1 * | 5/2001 | Sweeney et al. ............... | 430/5 |
| 6,627,362 B2 | 9/2003 | Stivers et al. | |
| 6,641,959 B2 | 11/2003 | Yan | |
| 6,753,538 B2 | 6/2004 | Musil et al. | |
| 6,821,682 B1 | 11/2004 | Stearns et al. | |
| 6,967,168 B2 | 11/2005 | Stearns et al. | |
| 2003/0064296 A1 | 4/2003 | Yan | |
| 2004/0062999 A1 | 4/2004 | Stearns et al. | |
| 2004/0131953 A1 * | 7/2004 | Sugiyama et al. ............. | 430/5 |
| 2005/0019675 A1 | 1/2005 | Hendriks et al. | |
| 2005/0185173 A1 | 8/2005 | Hau-Riege | |

(Continued)

FOREIGN PATENT DOCUMENTS

| | | |
|---|---|---|
| JP | 2002-313694 | 10/2002 |
| JP | 2005-322754 | 11/2005 |
| JP | 2005-321564 | 11/2006 |
| WO | 0034828 | 6/2000 |

OTHER PUBLICATIONS

"Method for compensation of extreme-ultraviolet multilayer defects", Ray-Chaudhuri et al., J. Vac. Sci. Technol. B17 (6), Nov./Dec. 1999.

(Continued)

*Primary Examiner* — Mark F Huff
*Assistant Examiner* — Rashid Alam
(74) *Attorney, Agent, or Firm* — Mayback & Hoffman, P.A.; Gregory L. Mayback; Rebecca A. Tie (57) ABSTRACT

An EUV mask comprises a substrate, a reflective multilayer on the substrate, a phase-shifting material disposed above the multilayer in at least one first portion of the substrate, and a masking material disposed above the multilayer in second portions of the substrate and corresponding to mask patterns of an EUV mask. There is also provided a method for repairing an EUV mask including a substrate, a reflective multilayer on the substrate and at least one defect beneath or within the multilayer. The method includes the steps of determining the position of a defect area of the substrate, in which a phase-shift difference of an exposure radiation is caused by the defect, and depositing a phase-shifting material above the multilayer in at least one first portion of the substrate, the first portion at least partially comprising the defect area.

37 Claims, 9 Drawing Sheets

U.S. PATENT DOCUMENTS

2005/0282072 A1   12/2005   Hector et al.
2006/0099517 A1   5/2006    Sugawara
2006/0166109 A1*  7/2006    Yan .................................. 430/5
2007/0054204 A1*  3/2007    Misaka ............................ 430/5

OTHER PUBLICATIONS

"Method for repairing Mo/Si multilayer thin film phase defects in reticles for extreme ultraviolet lithography", Mirkarimi et al., Journal of Applied Physics, vol. 91, No. 1, Jan. 1, 2002.

"EUVL mask blank repair", Barty, et al., Proc. of SPIE 4688 (2002), pp. 385-394.

"EUV and non-EUV inspection of reticle defect repair sites", Goldberg, et al., Emerging Lithographic Technologies XI, SPIE Advanced Lithography 2007—Proc. SPIE 6517-11.

Mandeep Singh, et al., "Wave-front correction methods for extreme-ultraviolet multilayer reflectors", Applied Optics, Apr. 1, 2003, vol. 42, No. 10, pp. 1847-1851.

* cited by examiner

EUV MASK AND METHOD FOR REPAIRING AN EUV MASK

CROSS-REFERENCE TO RELATED APPLICATION

This application claims the priority, under 35 U.S.C. §119, of copending German Application No. 10 2007 028 172.4, filed Jun. 20, 2007, which designated the United States and was not published in English; the prior application is herewith incorporated by reference herein in its entirety.

BACKGROUND OF THE INVENTION

In manufacturing microelectronic devices or microsystems, for instance, micromechanical devices, structures are formed in layers or substrates by lithographic processes. In such processes, usually, at first, resist patterns are formed in suitable resist materials and the resist patterns are transferred subsequently into a layer or a substrate using appropriate methods. Among others, photolithographic exposure processes are used as lithographic processes, wherein patterns formed in a mask are projected onto the resist material. In the course of further miniaturization of structures, exposure processes with extremely short wavelengths are used, for instance, extreme ultraviolet ("EUV") lithography processes use a wavelength of 13.6 nm. The EUV masks used are mostly reflective masks because virtually all materials strongly absorb radiation in this wavelength range. EUV masks typically comprise a substrate with a reflective multilayer disposed on it and a patterned masking layer disposed on the multilayer.

However, defects may arise during the manufacturing of EUV blanks or substrates or of the EUV masks that, in turn, cause defects during the exposure of resist materials. Examples of such defects are, for instance, contaminations on the surface of the mask, defects in the patterns of the masking layer or defects within or beneath the multilayer.

Defects within or beneath the multilayer usually are called multilayer defects. They may, for instance, comprise particles, which are disposed beneath the multilayer or which are enclosed within the multilayer, deformations of the multilayer due to bumps or pits on the substrate surface, like scratches, or local variations of the layer thickness or the roughness of single layers of the multilayer. These defects may cause a variation of the amplitude or the phase of a radiation reflected by the multilayer. The resulting phase difference in reference to the radiation reflected by portions without defects may cause variations of the intensity of the reflected radiation due to interferences.

SUMMARY OF THE INVENTION

The invention provides an EUV mask and method for repairing an EUV mask that overcomes the hereinafore-mentioned disadvantages of the heretofore-known devices and methods of this general type.

With the foregoing and other objects in view, there is provided, in accordance with the invention, an EUV mask, including a substrate, a reflective multilayer on top of the substrate, a phase-shifting material above the multilayer in at least one first portion of the substrate and a masking material above the multilayer in second portions of the substrate and corresponding to mask patterns of an EUV mask.

In accordance with another feature of the invention, the first portion comprises at least partially a defect area of the substrate, in which area a phase-shift difference of an exposure radiation is caused by a defect disposed one of beneath and within the multilayer.

In accordance with a further feature of the invention, the phase-shifting material has a thickness no greater than a thickness of the masking material.

In accordance with an added feature of the invention, the phase-shifting material has a thickness greater than zero and less than or equal to 100 nm.

In accordance with an additional feature of the invention, the phase-shifting material is of a given material and has a first thickness, the masking material is of the given material and a second thickness, and the first thickness is different from the second thickness.

In accordance with yet another feature of the invention, the phase-shifting material has a thickness varying within the first portion.

In accordance with yet a further feature of the invention, the phase-shifting material has a thickness constant within the first portion.

In accordance with yet an added feature of the invention, the first portion has a lateral spatial extension of greater than zero and less than or equal to 1.00 nm.

In accordance with yet an additional feature of the invention, the phase-shifting material has a first absorption ability with respect to a thickness thereof, the masking material has a second absorption ability with respect to a thickness thereof, and the first absorption ability of the phase-shifting material is no greater than the second absorption ability of the masking material.

In accordance with again another feature of the invention, the phase-shifting material comprises a material selected from at least one of zirconium, molybdenum, beryllium, carbon, and/or silicon dioxide.

In accordance with again a further feature of the invention, the phase-shifting material has a first absorption ability and a first phase-shifting ability, the masking material has a second absorption ability and a second phase-shifting ability, and at least one of the first absorption ability is less than the second absorption ability and the first phase-shifting ability is greater than the second phase-shifting ability.

In accordance with again an added feature of the invention, the phase-shifting material comprises a layer stack of different materials.

In accordance with again an additional feature of the invention, the first portion has a first lateral spatial extension, an entirety of the defect area has a second lateral spatial extension, and the first lateral spatial extension is smaller than the second lateral spatial extension.

In accordance with still another feature of the invention, the first portion is formed as a ring-shaped structure.

In accordance with still a further feature of the invention, the substrate has a defect area, first portions are disposed above the defect area, in the defect area, a phase-shift difference of an exposure radiation is caused by a defect disposed one of beneath and within the multilayer, and the first portions form a pattern adapted to the defect.

In accordance with still an added feature of the invention, the first portions have the phase-shifting material and the phase-shifting material in different ones of the first portions are of different materials.

In accordance with still an additional feature of the invention, the phase-shifting material has thickness, the first portion has a lateral spatial extension, and the phase-shifting material, the thickness of the phase-shifting material, and the lateral spatial extension of the first portion are selected to compensate a phase-shift difference of an exposure radiation reflected by the multilayer in a predetermined manner, the phase-shift difference being caused by a defect.

In accordance with another feature of the invention, the substrate has a defect area in which a phase-shift difference of an exposure radiation is caused by a defect disposed one of beneath and within the multilayer, several phase-shifting materials in several first portions of the substrate are disposed above the defect area, the several phase-shifting materials have thicknesses, the several first portions have lateral spatial extensions, the phase-shifting materials, the thicknesses of the phase-shifting materials, and the lateral spatial extensions of the several first portions and a configuration of the several first portions are adapted for each of the several first portion to compensate the phase-shift difference in a predetermined manner.

With the objects of the invention in view, there is also provided a method for repairing an EUV mask including a substrate, a reflective multilayer on top of the substrate, and at least one defect beneath or within the multilayer, the method including the steps of determining a position of a defect area of a substrate in which a phase-shift difference of an exposure radiation is caused by a defect in the defect area, and depositing a phase-shifting material above the multilayer in at least one first portion of the substrate, the first portion at least partially comprising the defect area.

In accordance with a further mode of the invention, there are provided the steps of determining at least one of a lateral spatial extension of the defect area and the phase-shift difference, and choosing a suitable material, a suitable thickness, and a suitable configuration of the phase-shifting material to affect the phase-shift difference of the reflected radiation in a predetermined manner after depositing the phase-shifting material.

In accordance with an added mode of the invention, the EUV mask is provided with a masking material disposed in second portions of the substrate above the multilayer and corresponding to mask patterns of the EUV mask.

In accordance with an additional mode of the invention the phase-shifting material is deposited using an electron-beam-induced gas-assisted local material deposition process.

In accordance with yet another mode of the invention, the phase-shifting material is deposited with a constant thickness in the first portion.

In accordance with yet a further mode of the invention, the phase-shifting material is deposited with a thickness varying from zero to a maximum thickness in the first portion.

In accordance with yet an added mode of the invention, the phase-shifting material is deposited with a thickness greater than zero and less than or equal to 100 nm.

In accordance with yet an additional mode of the invention, the phase-shifting material is deposited with a thickness no greater than a thickness of the masking material.

In accordance with again another mode of the invention, the phase-shifting material has a first absorption ability with respect to a thickness thereof, the masking material has a second absorption ability with respect to a thickness thereof, and the first absorption ability of the phase-shifting material is no greater than the second absorption ability of the masking material.

In accordance with again a further mode of the invention, the phase-shifting material is selected from zirconium, molybdenum, beryllium, carbon, and/or silicon dioxide.

In accordance with again an added mode of the invention, deposition is carried out by depositing the phase-shifting material as a layer stack of different materials.

In accordance with again an additional mode of the invention, deposition is carried out by depositing the phase-shifting material in several first portions above the defect area.

In accordance with still another mode of the invention, a predetermined pattern adapted to the defect area is formed with the several first portions.

In accordance with still a further mode of the invention, the first portion is formed as a ring-shaped structure.

In accordance with still an added mode of the invention, after depositing the phase-shifting material, the phase-shift difference of radiation reflected by the multilayer is determined, the phase-shift difference being caused by the defect and being affected by the phase-shifting material, the affected phase-shift difference is compared with a predetermined value of the phase-shift difference, and, if the affected phase-shift difference is larger than the predetermined value, the phase-shifting material is at least partially removed and/or newly deposited.

In accordance with still an additional mode of the invention, after depositing the phase-shifting material, the phase-shift difference of radiation reflected by the multilayer is determined, the phase-shift difference being caused by the defect and being affected by the phase-shifting material, the affected phase-shift difference is compared with a predetermined value of the phase-shift difference, and, if the affected phase-shift difference is larger than the predetermined value, a further phase-shifting material is deposited in the same first portion of the substrate and/or further first portions of the substrate.

With the objects of the invention in view, there is also provided a method for repairing a phase defect in a system including at least one layer where the phase defect is caused by a defect beneath or within the layer, the method including the steps of determining a position of a defect area of a system in which a phase-shift difference of an exposure radiation is being caused by a defect within the defect area, and depositing a phase-shifting material above at least one first portion of the system, the first portion at least partially comprising the defect area.

In accordance with another mode of the invention, a lateral spatial extension of the defect area and/or the phase-shift difference of a radiation affected by the system is determined, wherein the phase-shift difference is caused by the defect, and a suitable material, a suitable thickness and a suitable configuration of the phase-shifting material is selected such that the phase-shift difference of the affected radiation is changed in a predetermined manner after depositing the phase-shifting material.

In accordance with a further mode of the invention, the position-determining is carried out by determining a position of a defect area of a multilayer system.

With the objects of the invention in view, there is also provided a method for repairing an EUV mask, including the steps of providing a substrate with a reflective multilayer on top thereof, the substrate having at least one defect beneath or within the multilayer, determining a position of a defect area of the substrate in which a phase-shift difference of an exposure radiation is caused by the defect in the defect area, and depositing a phase-shifting material above the multilayer in at least one first portion of the substrate, the first portion at least partially comprising the defect area.

Although the invention is illustrated and described herein as embodied in an EUV mask and method for repairing an EUV mask, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures. The figures of the drawings are not drawn to scale.

Before the present invention is disclosed and described, it is to be understood that the terminology used herein is for the purpose of describing particular embodiments only and is not intended to be limiting. The terms "a" or "an", as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically.

As used herein, the term "about" or "approximately" applies to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION OF THE PREFERRED EMBODIMENTS

In the following detailed description, reference is made to the accompanying drawings, which form a part hereof and in which specific embodiments are illustrated, in which the invention may be practiced. In this regard, directional terminology such as "top", "bottom", "front", "back", "leading", "trailing", etc., is used with reference to the orientation of the Figures being described. Because components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
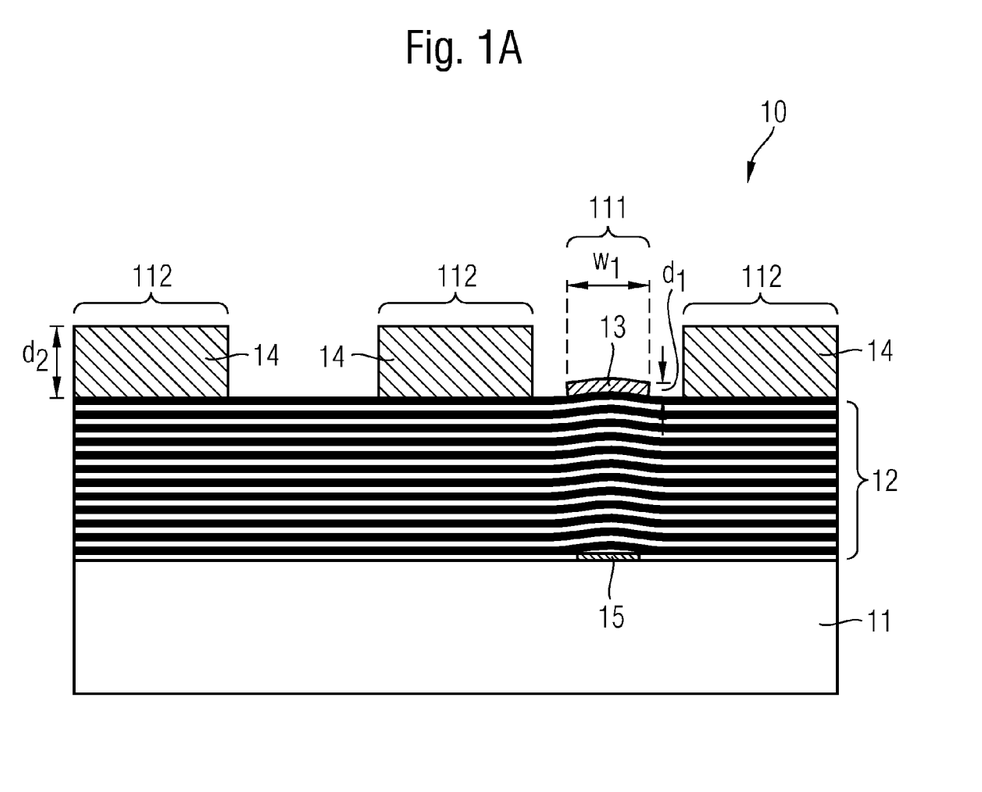
FIGS. 1A and 1B are fragmentary cross-sectional views through embodiments of an EUV mask with a phase-shifting material for repairing multilayer defects.

Referring now to the figures of the drawings in detail and first, particularly to FIG. 1A thereof, there is shown a cross-sectional view of an EUV mask 10. The EUV mask 10 comprises a substrate 11, a reflective multilayer 12, a phase-shifting material 13, and a masking material 14. The substrate 11 may be any kind of substrate or carrier material, such as glass or ceramic, and may comprise further layers. The multilayer 12 is disposed on top of the substrate 11. The multilayer 12 may be a layer stack comprising, for instance, 30 to 60 periods of alternating layers, which, for instance, comprise materials with different refractive indices, like molybdenum and silicon. A period of these layers may, for instance, have a thickness of about 7 nm. Instead of molybdenum and silicon also other materials, for instance beryllium or ruthenium, may be used. Furthermore, intermediate layers disposed on some or all interfaces within a period of these layers, for instance molybdenum/ruthenium/silicon or molybdenum/carbon/silicon.

The masking material 14 is disposed in second portions 112 of the substrate 11 on top of the multilayer 12. The masking material 14 may be an absorbing, reflective, or phase-shifting material or may comprise a layer stack of different materials. The masking material 14 may, for instance, be a metal, such as chromium, tantalum, titanium, aluminum, or tungsten, or metal compounds, such as TaN, TaBN, TaSix, or TiN, or a reflective layer stack similar to the multilayer or a phase-shifting material comprising, for instance, a material selected from the group of zirconium, molybdenum, beryllium, carbon or silicon dioxide. The masking material 14 corresponds to the mask patterns of the EUV mask. The masking material 14 has a thickness $d_2$.

The phase-shifting material 13 is disposed on top of the multilayer 12 at least in a first portion 111 of the substrate 11.

The phase-shifting material 13 has a thickness $d_1$ within the first portion 111. The thickness $d_1$ may be approximately the same within the whole first portion 111 or may vary over the first portion 111. The thickness $d_1$ may be equal to or different from the thickness $d_2$ of the masking material 14. The phase-shifting material 13 may comprise the same or another material as the masking material 14. If the phase-shifting material 13 and the masking material 14 are the same material, then the thickness $d_1$ of the phase-shifting material 13 is different from the thickness d2 of the masking material 14. The thickness d1 of the phase-shifting material 13 may for instance be smaller as or equal to 100 nm. Nevertheless, the thickness d1 may be larger as 100 nm and may be larger than the thickness d2 of the masking material 14.

The phase-shifting material 13 may, for instance, comprise a material selected from the group of zirconium, beryllium, carbon, or silicon dioxide. Nevertheless, other materials or layer stacks of different materials are possible. The phase-shifting material 13 may have, for instance, an absorption ability as small as possible and a phase-shifting ability as large as possible. Furthermore, the phase-shifting material 13 may comprise additional materials. By way of example, the phase-shifting material 13 may comprise elemental carbon, that is, carbon which is not chemical bounded, and hydrogen. Furthermore, the phase-shifting material 13 may comprise amorphous carbon, which may contain residues of organic compounds. The phase-shifting material 13 may have a lower or at most the same absorption ability with respect to the thickness $d_1$ of the phase-shifting material 13 as the masking material 14. The absorption coefficient of the phase-shifting material 13 itself may be larger than that of the masking material 14.

The phase-shifting material 13 may comprise a layer stack of several layers of different materials. At least the material of one layer has a phase-shifting ability. The materials of other layers may not have a phase-shifting ability. For instance, a cap layer may be disposed as an uppermost layer of the layer stack, where the cap layer may improve the reliability of the layer stack or may have a positive effect on the layer stack during processing or employment of the EUV mask.

The optical properties of a material may be described by the complex refractive index n:

$$n=n(1-i\kappa), \quad (1)$$

where n is the real part of the complex refractive index and κ is the absorption index. The imaginary part of the complex refractive index n, that is k=nκ, describes the absorption ability of a material, where the real part describes a phase shift caused by the material. The imaginary part k of the complex refractive index n may be a small positive number for wavelengths in the EUV range for the phase-shifting material 13. The real part of the complex refractive index n may be a positive number near 1 for wavelengths in the EUV range for the phase-shifting material 13. Typical values lie in the range between 0.95 and 1, nevertheless other values are possible.

The phase-shifting material 13 serves for the compensation of a difference in the phase shift of an incoming exposure beam, which is reflected by the multilayer 12. Such a phase-shift difference may be caused, for instance, by a defect 15 that is disposed beneath or within the multilayer 12, for example, in a lower part of the multilayer 12. The phase-shift difference describes a difference in the phase shift in comparison to a defect-free portion of the substrate 11. A bump-type defect 15 is shown beneath the multilayer 12 in, for example, in FIG. 1A. Nevertheless, the defect 15 may be formed also within the multilayer 12, for instance, by locally different layer thicknesses of single layers of the multilayer 12 or by a particle embedded in the multilayer 12. The defect 15 may also be a pit-type defect caused, for instance, by a pore or a scratch in the surface of the substrate 11 or by layers within the multilayer 12, which are locally not formed or which are locally formed with too small of a thickness. The defect 15 is an irregular pattern of the mask, that is, it is neither a mask pattern that is to be projected onto the resist material, nor a pattern intentionally formed.

The first portion 111 in which the phase-shifting material 13 is disposed comprises at least partially a defect area of the substrate 11, in which a difference in the phase shift of an exposure radiation is caused by the defect 15. This area is not restricted onto a portion of the substrate 11 in which the defect 15 exists. In other words, the first portion 111 may comprise the portion of the substrate 11 in which the defect 15 exists, at least partially. However, the first portion 111 may comprise a portion of the substrate 11 in which the defect 15 is not present but in which the defect 15 causes a phase-shift difference of the exposure radiation. Thus, the first portion 111 may comprise the portion of the substrate 11 in which the defect 15 exists partially, completely, or even not at all.

Figure 1B:
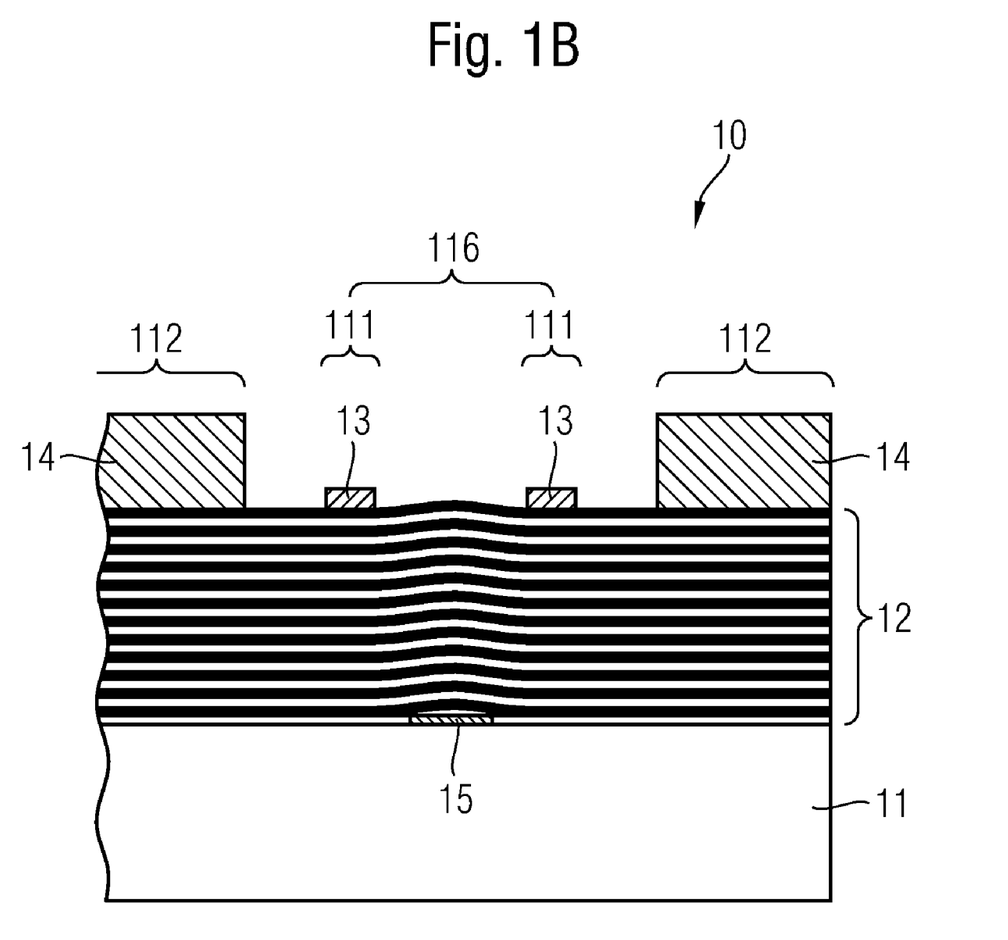

With respect to FIG. 1B, the correspondence between a portion of a substrate (in which a defect is formed beneath or within a multilayer), a defect area of the substrate (in which a difference in the phase shift of an exposure radiation is caused by the defect), and a first portion (in which the phase-shifting material is disposed to compensate the defect) will be explained. A substrate 11, a multilayer 12 disposed on top thereof, and a masking material 14 disposed on the multilayer 12 are shown in FIG. 1B. A defect 15 is disposed beneath the multilayer 12 and causes a difference in the phase shift of a reflected exposure radiation within a defect area 116. The defect area 116 may be larger than a portion of the substrate 11 directly above the defect 15. The defect area 116 even may be at a distance from the portion of the substrate 11 directly above the defect 15. A phase-shifting material 13 is above the multilayer 12 in a first portion 111. The first portion 111 may be formed, for instance, annularly, that is in form of a ring, as shown in FIG. 5B in plan view. Thus, the first portion 111 appears as two separate portions in the cross-sectional view of FIG. 1B. The first portion 111 comprises at least partially the defect area 116. Furthermore, the phase-shifting material 13 may be formed outside the defect area 116 to reduce a gradient in the phase shift between the defect area 116 and a portion of the substrate with an unaffected phase.

A configuration of the defect 15 between second portions 112, in which the masking material 14 exists, is shown in FIGS. 1A and 1B. In another embodiment, the defect 15 may be within a second portion 112. In the case that the masking material 14 is a reflective or a phase-shifting material, a defect 15 disposed beneath the masking material 14 also causes an undesired phase shift of a reflected exposure beam. Thus, the phase-shifting material 13 may also be formed above the masking material 14 so that a corresponding second portion 112 and the first portion 111 may at least partially overlap. However, the phase-shifting material 13 may also be disposed above an absorbing masking material 14.

The first portion 111 in which the phase-shifting material 13 is formed has a lateral spatial extension $w_1$. The extension $w_1$ as well as the shape of the first portion 111 may be defined by the lateral spatial extension in the shape of the defect 15. The extension $w_1$ of the first portion 111 may be smaller or larger than or equal to the extension of the defect 15. If, for instance, the extension $w_1$ is smaller than the extension of the defect 15, several first portions 111 with a phase-shifting material 13 may be above the defect 15. The extension $w_1$ may be, for instance, smaller than or equal to 100 nm. The extension $w_1$ may be, for instance, larger than or equal to 50 nm.

All materials have defined optical properties, which describe the absorption, the reflection, or the phase shift of radiation that hits or impacts a material. If the thickness or the configuration of a material varies locally, for instance, due to a defect, local differences in the radiation crossing the material or being reflected by the material are caused. These differences may affect the amplitude or the phase of the crossing or reflected radiation. Phase differences of the crossing or reflected radiation caused by the defect may be reduced to a negligible degree by disposing a phase-shifting material above the material, which comprises the defect, within a portion, in which the crossing or reflected radiation is affected by the defect. Thus, the use of a phase-shifting material for compensation of a phase difference caused by a defect is not restricted to the EUV mask or other reflective materials as described in this application, but may also be used for other applications, for instance, conventional transparent photo masks, optical devices such as lenses or mirrors, or layers affecting a radiation.

This allows a repair of phase defects that is independent from further features of the material comprising the defect or of a device comprising the material including the defect. By way of example, the repair is independent from the use of a masking material on an EUV mask, that is, from the design of the EUV mask. Thus, for instance, defects, which are at a large distance from portions of the mask with a masking material, may be compensated. Furthermore, pit-type as well as bump-type defects causing a phase-shift difference may be compensated. The compensation may be adjusted very precisely to the lateral spatial extension and the shape as well as to the phase-shifting effect of the defect.

Furthermore, the configuration of the phase-shifting material affects the material comprising the defect or the device comprising the material including the defect only in a very small degree. For instance, only a small effect caused by electrostatic charging or by a thermal stress occurs during the repair. The repair is non-destructive, that is, the material comprising the defect, for instance, the multilayer, is neither altered nor directly affected by the repair. Therefore, a new repair is possible if the first repair attempt was not successful.

Figure 2A:
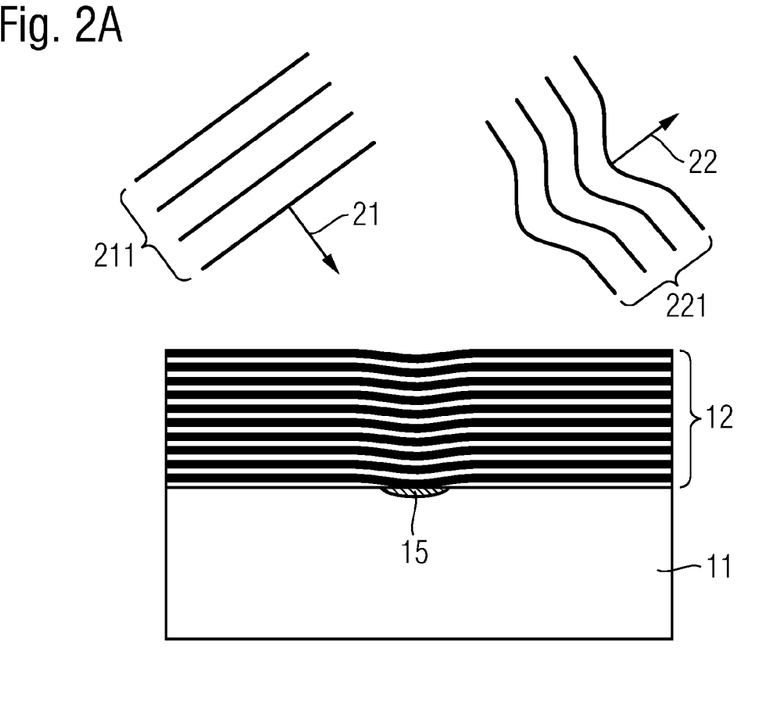
FIG. 2A is a fragmentary cross-sectional view illustrating an affect of a defect on an exposure radiation beam without a phase-shifting material.
Figure 2B:
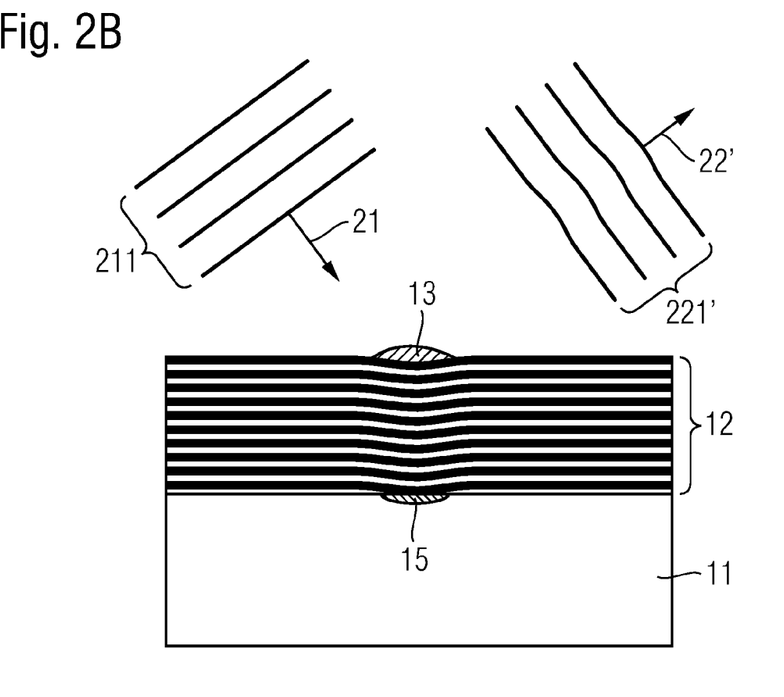
FIG. 2B is a fragmentary cross-sectional view illustrating an affect of a defect on an exposure radiation beam with a phase-shifting material for repairing the defect according to the invention.

FIGS. 2A and 2B illustrate the affect of the phase-shifting material 13. A detail of an EUV mask is illustrated in a cross-sectional view in FIG. 2A. A reflective multilayer 12 is disposed on top of a substrate 11, wherein a defect 15 exists beneath the multilayer 12. By way of example, a pit-type defect 15 is illustrated. The multilayer 12 reflects an incoming exposure radiation 21 having a phase front 211. The reflected exposure radiation 22, which is reflected by the multilayer 12 with the defect 15 lying therebeneath, has a phase front 221 that is retarded in comparison to a reflected exposure radiation reflected by a defect-free multilayer 12.

A detail of an embodiment of an EUV mask according to the invention is shown in a cross-sectional view in FIG. 2B. A phase-shifting material 13 is disposed above the multilayer 12 in a portion above the defect 15. Because the phase of an EUV exposure radiation is typically advanced during crossing a phase-shifting material, the phase retardation of the reflected exposure radiation 22' caused by the defect is compensated at least partially. Thus, the phase difference of the phase front 221' between that portion reflected by the multilayer 12 with the defect 15 lying beneath it and other portions reflected by the defect-free multilayer 12 is reduced to such a value that the affect on an exposure using the EUV mask is negligible.

The affect of a pit-type defect 15 and of the repair of the defect is illustrated in FIGS. 2A and 2B. A pit-type defect 15 causes a retarded phase of the reflected exposure radiation 22, whereas a bump-type defect causes an advanced phase of the reflected exposure radiation 22. Because the phase of a radiation in the EUV range is typically advanced during crossing a material, the phase-shifting material 13 may be configured so that the phase of the reflected exposure radiation 22' is advanced so that the phase difference of the phase front 221' between a portion reflected by the multilayer 12 with the defect 15 lying beneath it and other portions reflected by a defect-free portion of the multilayer 12 may be reduced to near 0°. Thus, the affect of such a defect 15 on an exposure using the EUV mask may be reduced to a negligible degree.

Because the degree of the phase shift caused by the phase-shifting material 13 for a given exposure radiation depends on the material used and its thickness, the phase shift may be affected by a corresponding choice of the material and of the thickness of the phase-shifting material. Thus, it is possible to compensate the phase-shift difference so that undesired destructive interference of radiation waves will not occur in any portion of an EUV mask according to an embodiment of the invention during an exposure using the EUV mask. Nevertheless, it is also possible to permit portions on the EUV mask in which such an undesired destructive interference of radiation waves occurs. In such a case, the natural spatial extension of these portions may be reduced so that they will not be printed into a resist material during an exposure due to the limited resolution of the projection optics or of the resist material in which the patterns of the mask will be printed.

Figure 3A:
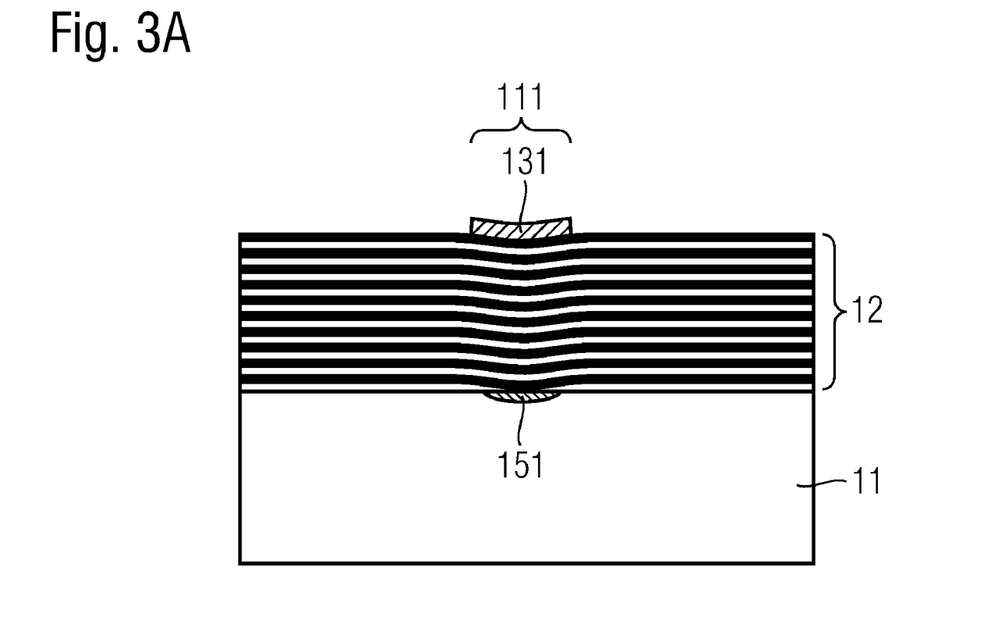
FIGS. 3A and 3B are a fragmentary cross-sectional views illustrating details of embodiments of an EUV mask according to the invention with a phase-shifting material having a uniform thickness.
Figure 3B:
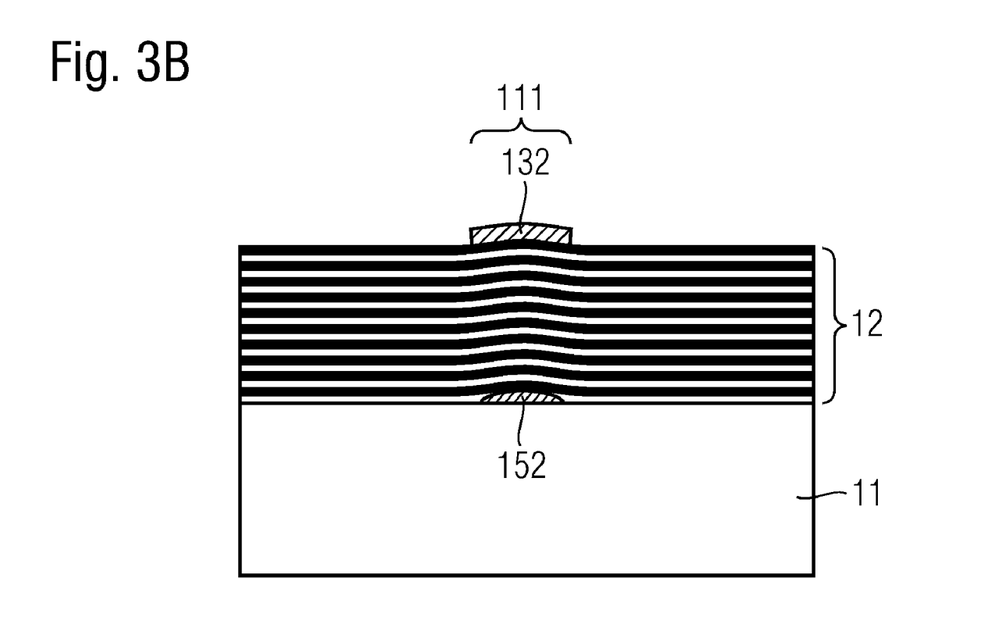

FIGS. 3A and 3B illustrate details of embodiments of an EUV mask in a cross-sectional view, where a phase-shifting material 131 or 132, respectively, has a uniform constant layer thickness across the whole first portion 111. "Constant layer thickness" as used herein means that the layer thickness varies by less than 5% across the whole first portion 111. FIG. 3A illustrates an embodiment for a pit-type defect 151, whereas FIG. 3B illustrates an embodiment for a bump-type defect 152. The phase-shifting material 131 or 132, respectively, causes a phase shift by a fixed degree across the whole first portion 111. The phase-shift difference caused by the defect 151 or 152, respectively, may be not completely compensated. By way of example, portions in which the difference may be positive or negative may be present in the phase front of the reflected exposure radiation. However, the resulting difference may be reduced to a value smaller than a predetermined critical value.

Figure 4A:
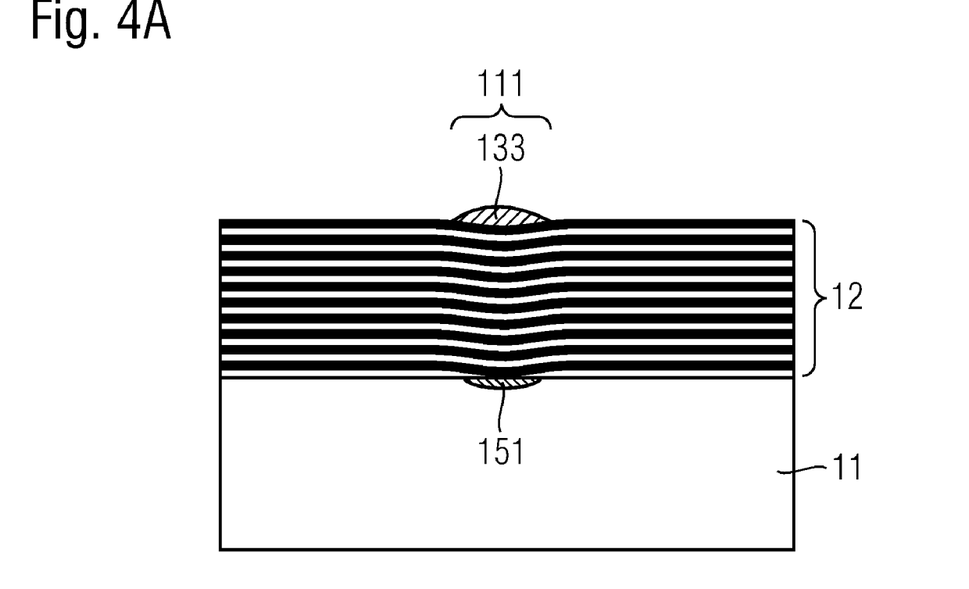
FIGS. 4A and 4B are a fragmentary cross-sectional views illustrating details of further embodiments of an EUV mask according to the invention with a phase-shifting material having a varying thickness.
Figure 4B:
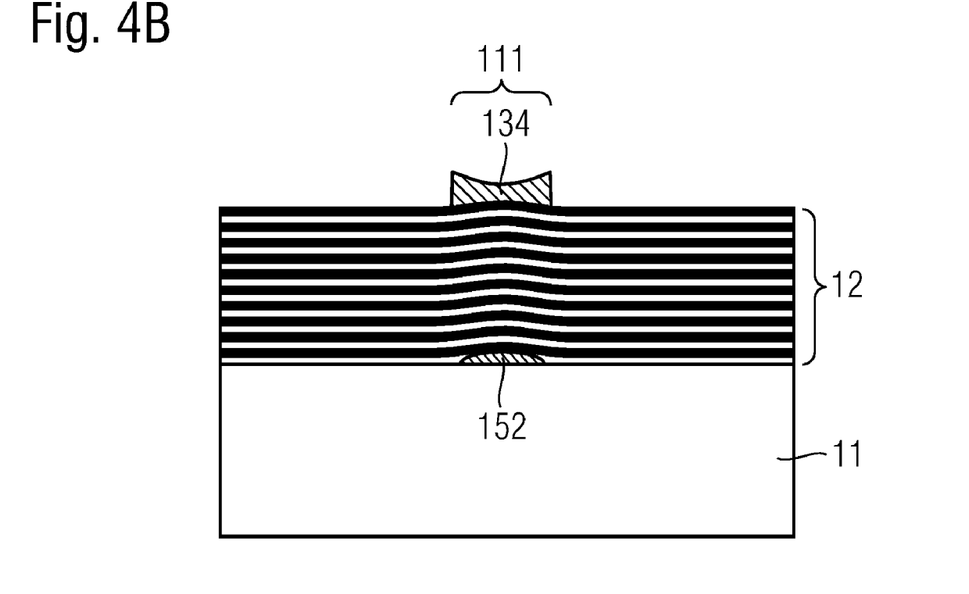

FIGS. 4A and 4B illustrate details of embodiments of an EUV mask in a cross-sectional view where the phase-shifting material 133 or 134, respectively, has a varying layer thickness across the first portion 111. FIG. 4A illustrates an embodiment for a pit-type defect 151, whereas FIG. 4B illustrates an embodiment for a bump-type defect 152. The layer thickness of the phase-shifting material 133 or 134, respectively, is locally adapted to a phase shift, which occurs at this position and is caused by the defect 151 or 152, respectively. Thus, the phase-shift difference may be compensated smoother and more precisely with respect to the embodiments illustrated in FIGS. 3A and 3B.

FIGS. 5A to 5E illustrate plan views on several embodiments of a configuration of phase-shifting material. A multilayer 12 with a defect 15 lying beneath it or being disposed within the multilayer 12 is illustrated in FIGS. 5A to 5E. An approximately circular defect 15 is shown in the figures for the sake of simplicity. However, the defect 15 may have an oval shape, a line-like shape, or any other shape. A portion above the defect 15 may have, for instance, a lateral spatial extension $w_3$, which may correspond to the characteristic spatial extension of the defect. The characteristic spatial extension may be, for instance, the spatial extension of that portion in which the phase difference of the reflected radiation is larger than 30° with respect to the phase in portions, in which the radiation is not affected by the defect.

Figure 5A:
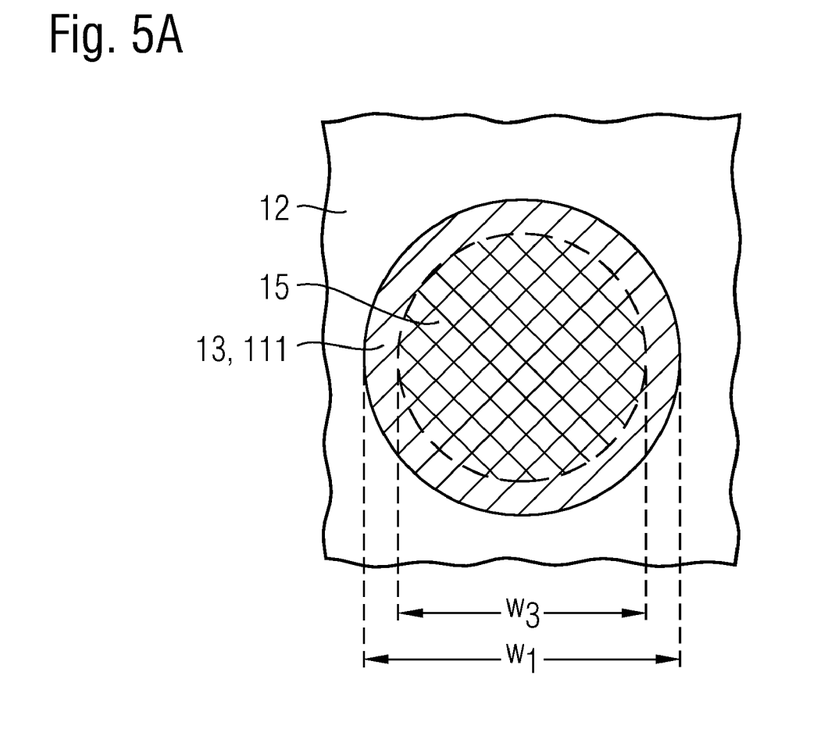
FIGS. 5A to 5E are fragmentary plan views illustrating different embodiments of configurations of phase-shifting materials for repairing the defect according to the invention.
Figure 5B:
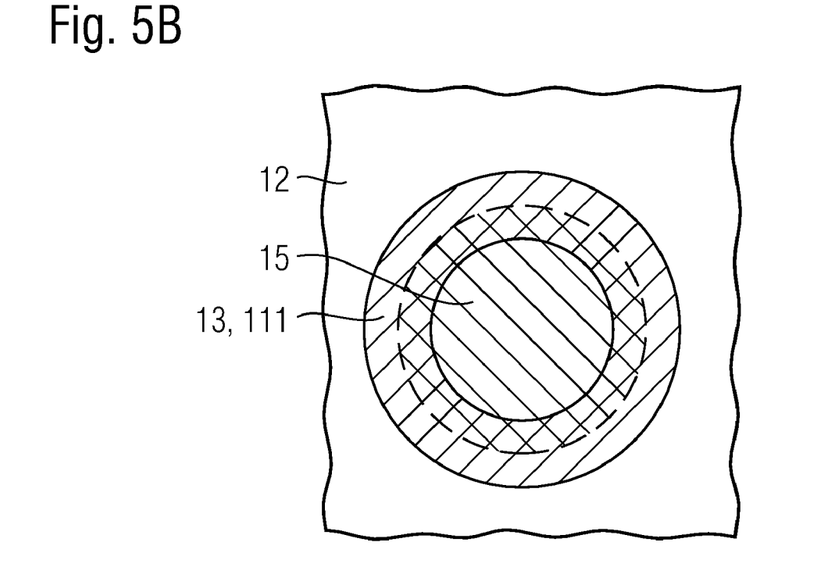

A phase-shifting material 13 in a compact (closed) and continuous first portion 111 above the defect 15 and the multilayer 12 is shown in FIG. 5A. The first portion 111 comprises the whole portion above the defect 15. The shape of the first portion 111 may be adapted to the shape of the defect 15. In the embodiment shown in FIG. 5A, a lateral spatial extension $w_1$ of the first portion 111 is larger than the lateral spatial extension $w_3$ of the portion above the defect 15. Nevertheless, the phase-shifting material 13 may be disposed as a compact layer in a first portion 111 whose lateral spatial extension $w_1$ is smaller than or equal to the lateral spatial extension $w_3$. The first portion 111 may be disposed centrally above the defect 15. According to another embodiment, the first portion 111 may be disposed eccentrically above the defect 15, that is, a center point of the first portion 111 may be shifted with respect to a center point of the portion above the defect 15. The borderline of the first portion 111 may be disposed at a distance from a borderline of the defect 15, wherein the distance may be different for different positions of the borderline of the first portion 111.

A ring-shaped configuration of the phase-shifting material 13 above the defect 15 is shown in FIG. 5B. The phase-shifting material 13 is disposed in a first portion 111, which is formed as a continuous ring-shaped structure. The first portion 111 covers an edge of a portion above the defect 15, but does not cover a portion inside the portion above the defect 15. The first portion 111 may be disposed concentrically with respect to a center point of the defect 15, as shown in FIG. 5B, but may also be shifted with respect to the center point of the defect 15. Furthermore, the first portion 111 may not completely overlap the edge of the portion above the defect 15. According to a further embodiment, the first portion 111 may extend completely within the portion above the defect 15 or may extend completely outside the portion above the defect 15.

Figure 5C:
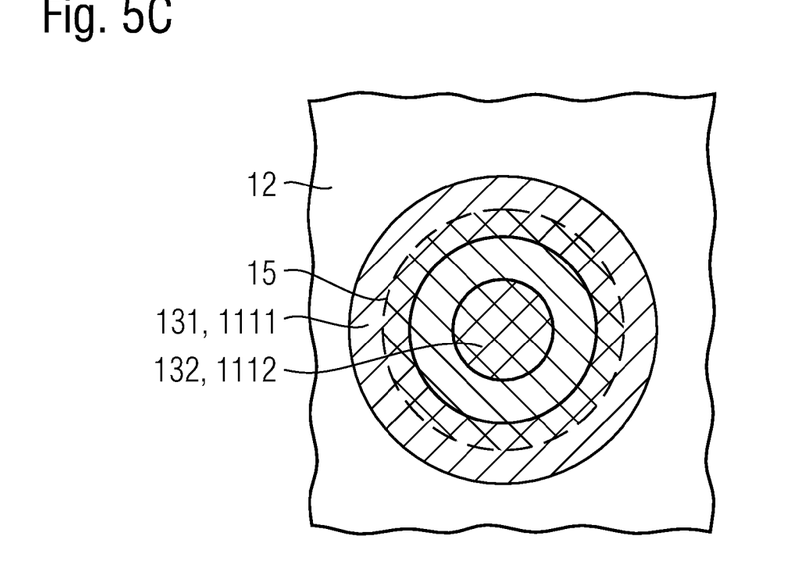

According to an embodiment shown in FIG. 5C, two first portions 1111, 1112 with phase-shifting materials 131, 132 are disposed above the defect 15. The first portion 1111 may, for instance, be a ring-shaped structure as described with respect to FIG. 5B. The first portion 1112 may be a circular structure, as described with respect to FIG. 5A. The first portions 1111 and 1112 may be portions separated from each other and may not form a compact structure. Nevertheless, they may completely or partially overlap or may form a closed structure. They may be disposed concentrically, as shown in FIG. 5C, or may be shifted with respect to each other. Furthermore, the first portions 1111 and 1112 may partially overlap the portion above the defect 15 or may cover an area completely within or completely outside the portion above the defect 15. The phase-shifting materials 131 and 132 may be the same material or may comprise different materials and may have the same or different thicknesses.

Figure 5D:
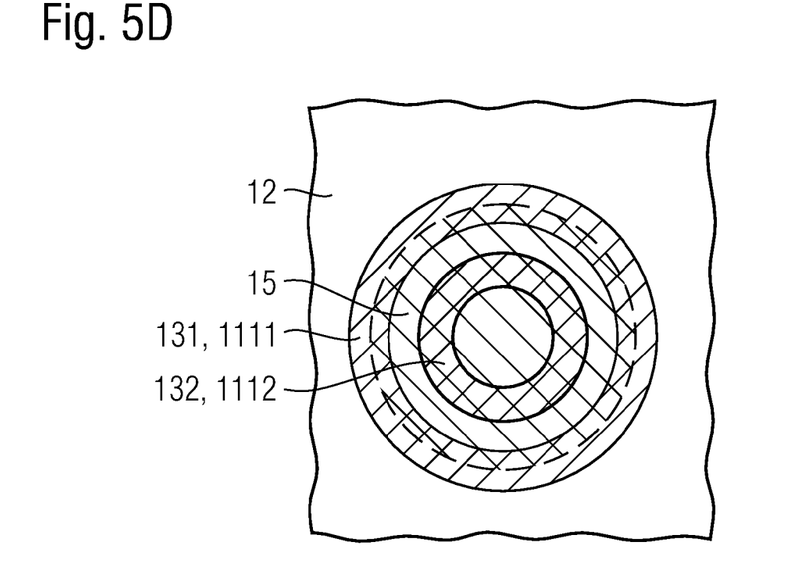

FIG. 5D illustrates a further embodiment, in which phase-shifting materials 131, 132 are disposed in first portions 1111 and 1112 above a defect 15. Both first portions 1111 and 1112 have a ring-shaped structure, wherein the first portion 1111 may be configured as, for example, described with respect to FIG. 5B. Both first portions 1111 and 1112 may be disposed concentrically or may be shifted with respect to one another. Both first portions 1111 and 1112 may be disposed completely within a portion above the defect 15. Nevertheless, one or both first portions 1111 and 1112 may be disposed outside the portion above the defect 15. Furthermore, further first portions with a phase-shifting material may be configured as circular structures or as ring-shaped structures above the defect 15, as described with respect to FIG. 5A.

Figure 5E:
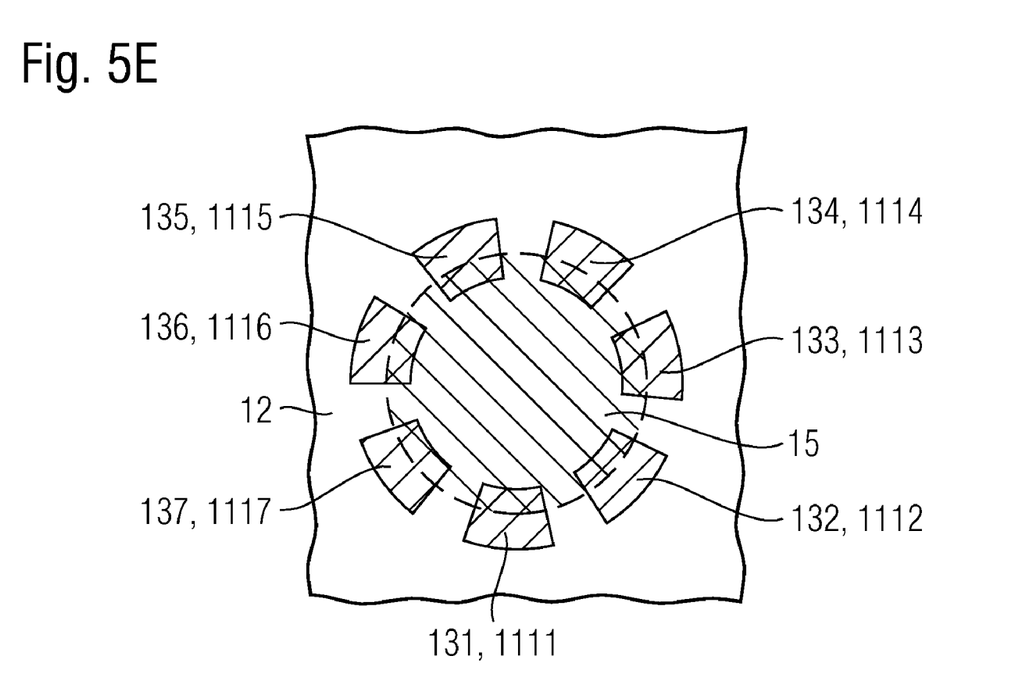

FIG. 5E illustrates a further embodiment, in which phase-shifting materials 131 to 137 are configured in first portions 1111 to 1117. By way of example, seven first portions with a phase-shifting material are illustrated in FIG. 5E. According to other embodiments, less or more first portions with a phase-shifting material may exist. The first portions 1111 to 1117 are formed as ring segments, which may have different dimensions, for example, angles, inner radius, and outer radius. As described above, specific first portions 1111 to 1117 may overlap or may not overlap and may be disposed concentrically or shifted with respect to the portion above the defect 15. The first portions 1111 to 1117 may be portions that are separated from each other and that do not form a compact structure, and may be disposed shifted to each other. According to other embodiments, the first portions 1111 to 1117 and further first portions may be formed as circular, oval, rectangular or otherwise-shaped portions. The first portions 1111 to 1117 and further first portions may also form other patterns, for instance, a checkerboard pattern, crossing lines, or lines running side by side.

The phase-shifting materials 131 to 137 and further phase-shifting materials may be the same material or may comprise different materials. The phase-shifting materials 131 to 137 may have the same or different thicknesses.

As described with respect to FIGS. 5A to 5E, a phase-shifting material 13 or different phase-shifting materials may be disposed such that a phase-shift difference caused by a defect 15 may be compensated as well as possible. Thus, phase defects on an EUV mask may be corrected and the EUV mask may be repaired. As illustrated in FIGS. 5A to 5E, the first portion 111 may comprise a portion of a substrate above a defect 15 at least partially. Nevertheless, the first portion 111 may be disposed in another portion of the substrate at a distance from the defect 15; in other words, the first portion 111 may not comprise the portion above the defect 15. Furthermore, a second portion 112 with a masking material 14 may overlap the portion above the defect 15 at least partially. The second portion 112 may comprise the first portion 111 partially or completely. According to other embodiments, the first portion 111 or several first portions 111 may comprise the second portion 112 with the masking material 14 partially or completely.

Figure 6:
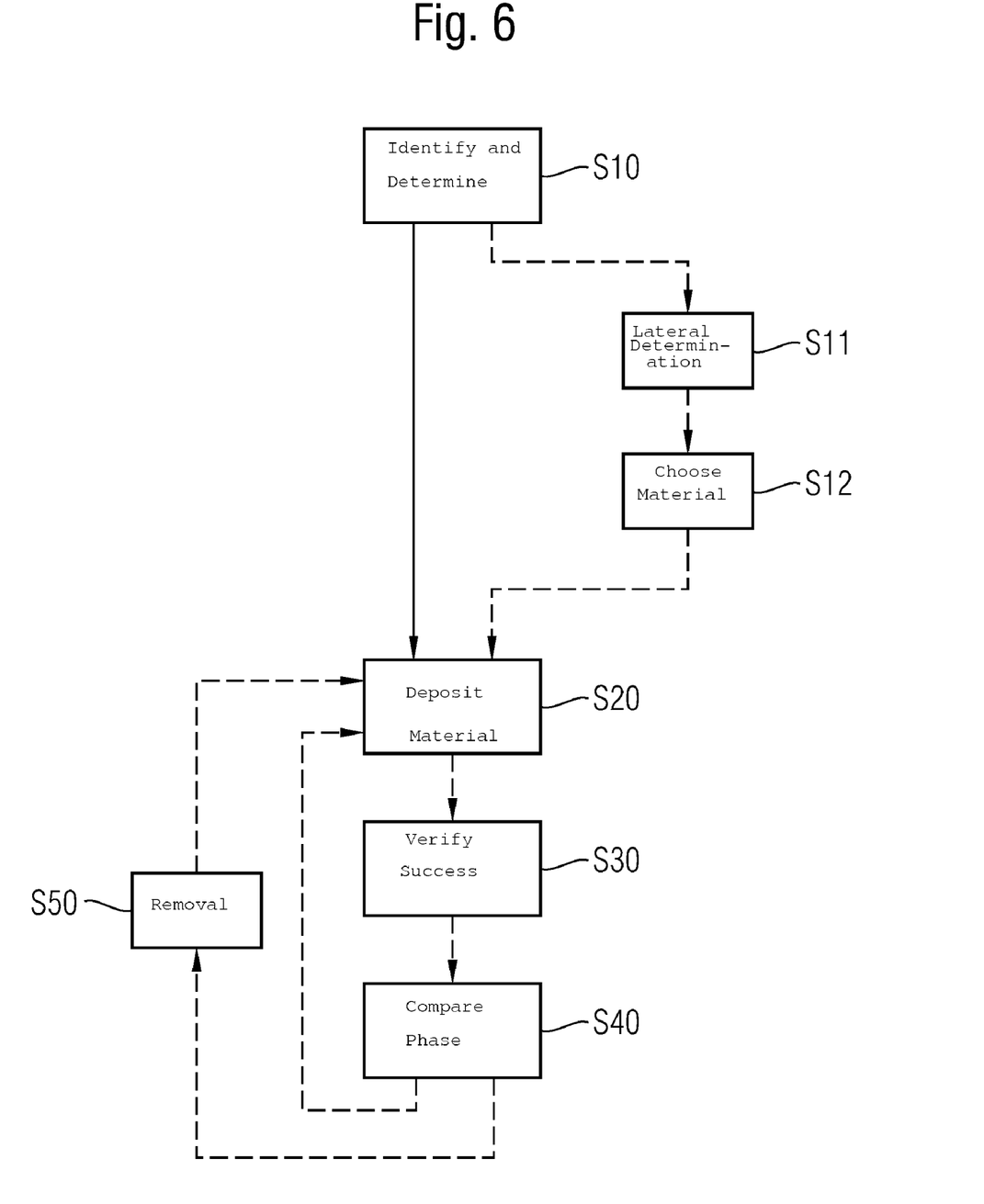
FIG. 6 is a flowchart of an exemplary embodiment of a method for repairing an EUV mask according to the invention.

FIG. 6 illustrates a flow diagram of an exemplary embodiment of a method for repairing an EUV mask. The EUV mask that has to be repaired comprises a substrate, a reflective multilayer disposed on the substrate, and at least one defect beneath or within the multilayer. Optionally, the EUV mask may comprise a masking material that is disposed in second portions of the substrate above the multilayer and that corresponds to the mask patterns of the EUV mask. First, the defect on the mask is identified and the position of a defect area of the substrate, in which a phase-shift difference of an exposure radiation is caused by the defect, is determined on the mask in step S10. Defect maps of a mask substrate created by a supplier of the mask substrate or inspection methods of the mask substrate or of the patterned EUV mask may be used for determining the position of the defect area. Determining the defect area may be performed before disposing the multilayer onto the substrate or after that. Therefore, the mask substrate may comprise the multilayer disposed on the substrate or may be the substrate without the multilayer.

Optionally, a lateral spatial extension of the defect area as well as the phase-shift difference of the radiation reflected by the multilayer may be determined in step S11. A suitable material, a suitable thickness, and a suitable configuration of a phase-shifting material, which will be disposed, may be chosen using the determined data in step S12. A simulation method may be used for this step. The material, the thickness, and the configuration of the phase-shifting material are chosen so that the phase-shift difference of the reflected radiation is affected in a predetermined manner after a deposition of the phase-shifting material. Performing the optional steps S11 and S12 allows a more precise and a more successful compensation of the identified phase-shifting defect in comparison to a method comprising a deposition of a phase-shifting material, whose material, thickness, and configuration are determined based upon, for instance, average values.

Subsequently, a phase-shifting material is deposited above the multilayer in at least one first portion of the substrate in step S20, wherein the first portion at least partially comprises the defect. The first portion comprises the substrate and the multilayer. The phase-shifting material may be deposited using an e-beam induced gas-assisted local material deposition method. In such a method, at least one gaseous precursor is brought into a deposition system comprising the EUV mask that has to be repaired. Molecules of the precursor are adsorbed on a surface of the EUV mask and are locally activated by a focused electron beam. The activated precursor molecules are converted to a solid deposited material, which is the phase-shifting material. This deposition method allows a precise deposition of the phase-shifting material in a predetermined configuration, wherein the precision is defined by the resolution of the electron beam. Furthermore, the local control of the induced dose of the electron beam allows a precise definition of the thickness of the deposited phase-shifting material. By way of example, the thickness of the phase-shifting material may be locally varied.

The phase-shifting material may be deposited in the first portion with an approximately constant thickness or with a thickness that varies within the first portion from zero to a maximum thickness. The phase-shifting material may be deposited, for instance, with a thickness of not larger than 100 nm. The phase-shifting material may be deposited with the same or with a different thickness as the masking material that is disposed or will be disposed on the EUV mask.

The phase-shifting material may have a lower or at most an equal absorption ability as the masking material, wherein the absorption ability relates to the thickness of the phase-shifting or of the masking material, respectively. The absorption coefficient of the phase-shifting material may be larger than that of the masking material. The phase-shifting material may comprise, for instance, a material selected from the group of zirconium, molybdenum, beryllium, carbon or silicon dioxide. The phase-shifting material may, for instance, have an absorption ability as small as possible and a phase-shifting ability as large as possible. Furthermore, the usual requirements, like process compatibility and material stability, should be considered when choosing the phase-shifting material.

The phase-shifting material may be deposited in different configurations, as for instance described with respect to FIGS. 5A to 5E. By way of example, the phase-shifting material may be deposited in several first portions. The phase-shifting material of several first portions may comprise different materials and may have different thicknesses.

Optionally, a verification of the repair success may be performed subsequently to the deposition of the phase-shifting material by determining the phase-shift difference of a radiation reflected by the multilayer, wherein the phase-shift difference is caused by the defect and affected by the phase-shifting material, in step S30. Another possibility to verify the repair success is to determine an aerial image generated by the repaired EUV mask.

The affected phase-shift difference or the aerial image of the repaired EUV mask, which are determined in step S30, may be compared with a predetermined value of the phase-shift difference or with a predetermined aerial image, respectively, in step S40.

If the affected phase-shift difference is larger than the predetermined value or if the determined aerial image does not meet the predetermined aerial image, a further repair of the EUV mask may be performed. The further repair may comprise a deposition of a further phase-shifting material in the same or in further first portions of the substrate in step S20. Nevertheless, the further repair may comprise removing the phase-shifting material at least partially in step S50 and newly depositing a phase-shifting material occurs in step S20. The newly deposited phase-shifting material may comprise another material and or may have another thickness or another configuration as the originally deposited phase-shifting material.

The steps of determining a state of the EUV mask in step S30 after depositing a phase-shifting material and of comparing the determined state with a predetermined state in step S40 as well as the steps of a further repair may be repeated as long as the determined state does not meet the predetermined state.

The method described with respect to FIG. 6 may be used for repairing a phase defect in any multilayer system or in a system with at least one layer affecting a radiation, which crosses the layer or which is reflected by the layer. The method is not restricted to the repair of EUV masks.

The embodiments of the invention described in the foregoing description are examples given by way of illustration and the invention is in no way limited thereto. Any modification, variation and equivalent configuration should be considered as being included within the scope of the invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention is limited only by the claims and the equivalents thereof.

I claim:

1. An EUV mask, comprising:
   a substrate;
   a reflective multilayer on top of said substrate;
   a phase-shifting pattern above said multilayer in at least one first portion of said substrate; and
   a masking material above said multilayer in second portions of said substrate and corresponding to mask patterns of an EUV mask, wherein the at least one first portion at least partially overlaps with a defect area of the substrate, in which a phase-shift difference of an exposure radiation reflected by the multilayer is caused by a defect disposed one of beneath and within the multilayer, the phase-shifting pattern being configured to compensate for the phase-shift difference.

2. The EUV mask according to claim 1, wherein said phase-shifting pattern has a thickness no greater than a thickness of said masking material.

3. The EUV mask according to claim 1, wherein said phase-shifting pattern has a positive thickness less than or equal to 100 nm.

4. The EUV mask according to claim 1, wherein:
said phase-shifting pattern is of a given material and has a first thickness;
said masking material is of said given material and a second thickness; and
said first thickness is different from said second thickness.

5. The EUV mask according to claim 1, wherein said phase-shifting pattern has a thickness varying within said at least one first portion.

6. The EUV mask according to claim 1, wherein said phase-shifting pattern has a thickness constant within said at least one first portion.

7. The EUV mask according to claim 1, wherein said phase-shifting pattern first has a lateral spatial extension of less than or equal to 100 nm.

8. The EUV mask according to claim 1, wherein:
said phase-shifting pattern has a first absorption ability with respect to a thickness thereof;
said masking material has a second absorption ability with respect to a thickness thereof; and
said first absorption ability of said phase-shifting pattern is no greater than said second absorption ability of said masking material.

9. The EUV mask according to claim 1, wherein said phase-shifting pattern comprises a material selected from at least one of a group consisting of zirconium, molybdenum, beryllium, carbon, and silicon dioxide.

10. The EUV mask according to claim 1, wherein:
said phase-shifting pattern has a first absorption ability and a first phase-shifting ability;
said masking material has a second absorption ability and a second phase-shifting ability; and
at least one of:
said first absorption ability is less than said second absorption ability; and
said first phase-shifting ability is greater than said second phase-shifting ability.

11. The EUV mask according to claim 1, wherein said phase-shifting pattern comprises a layer stack of different materials.

12. The EUV mask according to claim 1, wherein:
said phase-shifting pattern has a first lateral spatial extension;
an entirety of said defect area has a second lateral spatial extension; and
said first lateral spatial extension is smaller than said second lateral spatial extension.

13. The EUV mask according to claim 1, wherein said at least one first portion is formed as a ring-shaped structure.

14. The EUV mask according to claim 1, wherein:
said first portions have said phase-shifting pattern; and
said phase-shifting pattern is of different materials in different ones of said first portions.

15. The EUV mask according to claim 1, wherein:
said phase-shifting pattern has a thickness;
said phase-shifting pattern has a lateral spatial extension; and
said phase-shifting pattern, said thickness of said phase-shifting pattern, and said lateral spatial extension of said phase-shifting pattern, and a shape of the at least one first portion are selected to compensate for said phase-shift difference in a predetermined manner.

16. The EUV mask according to claim 1, wherein
said phase-shifting pattern has a plurality of sections, each section assigned to one of several first portions of said substrate;
said plurality of sections having thicknesses and comprising phase-shifting materials;
said several first portions having lateral spatial extensions;
said phase-shifting materials, said thicknesses of said plurality of sections, said lateral spatial extensions of said several first portions, and a configuration of said several first portions are adapted for each of said several first portions to compensate for said phase-shift difference in a predetermined manner.

17. A method for repairing an EUV mask including a substrate, a reflective multilayer on top of the substrate, and at least one defect beneath or within the multilayer, the method comprising:
determining a position of a defect area of a substrate in which a phase-shift difference of an exposure radiation is caused by a defect in the defect area; and
forming a phase-shifting pattern above the multilayer in at least one first portion of the substrate, the first portion at least partially overlapping with the defect area.

18. The method according to claim 17, which further comprises:
determining at least one of a lateral spatial extension of the defect area and the phase-shift difference; and
choosing a suitable material, a suitable thickness, and a suitable configuration of the phase-shifting pattern to affect the phase-shift difference of reflected radiation in a predetermined manner after forming the phase-shifting pattern.

19. The method according to claim 17, which further comprises providing the EUV mask with a masking material disposed in second portions of the substrate above the multilayer and corresponding to mask patterns of the EUV mask.

20. The method according to claim 17, which further comprises depositing a phase-shifting material for forming the phase-shifting pattern using an electron-beam-induced gas-assisted local material deposition process.

21. The method according to claim 17, which further comprises forming the phase-shifting pattern with a constant thickness in the at least one first portion.

22. The method according to claim 17, which further comprises forming the phase-shifting pattern with a thickness varying from zero to a maximum thickness in the at least one first portion.

23. The method according to claim 17, which further comprises depositing forming the phase-shifting pattern with a positive thickness less than or equal to 100 nm.

24. The method according to claim 19, which further comprises forming the phase-shifting pattern with a thickness no greater than a thickness of the masking material.

25. The method according to claim 19, wherein:
the phase-shifting pattern has a first absorption ability with respect to a thickness thereof;
the masking material has a second absorption ability with respect to a thickness thereof; and
the first absorption ability of the phase-shifting pattern is no greater than the second absorption ability of the masking material.

26. The method according to claim 17, which further comprises selecting a phase-shifting material for the phase-shifting pattern from at least one of a group consisting of zirconium, molybdenum, beryllium, carbon, and silicon dioxide.

27. The method according to claim 17, which further comprises carrying out the forming step by depositing a layer stack of different materials.

28. The method according to claim 17, which further comprises carrying out the forming step by depositing a phase-shifting material in several first portions, which are separated from each other.

29. The method according to claim 28, which further comprises forming a predetermined pattern adapted to the defect area with the several first portions.

30. The method according to claim 17, which further comprises forming the at least one first portion as a ring-shaped structure.

31. The method according to claim 17, which further comprises:
    after forming the phase-shifting pattern, determining the phase-shift difference of radiation reflected by the multilayer, the phase-shift difference being caused by the defect and being affected by the phase-shifting pattern;
    comparing the affected phase-shift difference with a predetermined value of the phase-shift difference; and
    if the affected phase-shift difference is larger than the predetermined value, at least partially removing and newly depositing a phase-shifting material forming the phase-shifting pattern.

32. The method according to claim 17, which further comprises:
    after forming the phase-shifting pattern, determining the phase-shift difference of radiation reflected by the multilayer, the phase-shift difference being caused by the defect and being affected by the phase-shifting pattern;
    comparing the affected phase-shift difference with a predetermined value of the phase-shift difference; and
    if the affected phase-shift difference is larger than the predetermined value, forming a further phase-shifting pattern in at least one of:
        the same first portion of the substrate; and
        further first portions of the substrate.

33. A method for repairing a phase defect in a system including at least one layer where the phase defect is caused by a defect beneath or within the layer, the method comprising:
    determining a position of a defect area of a system in which a phase-shift difference of an exposure radiation is being caused by a defect within the defect area; and
    forming a phase-shifting pattern above at least one first portion of the system, the first portion at least partially overlapping with the defect area.

34. The method according to claim 33, which further comprises:
    determining a lateral spatial extension of the defect area and/or the phase-shift difference of a radiation affected by the system, wherein the phase-shift difference is caused by the defect; and
    choosing a suitable material, a suitable thickness and a suitable configuration of the phase-shifting pattern such that the phase-shift difference of the affected radiation is changed in a predetermined manner after depositing forming the phase-shifting pattern.

35. The method according to claim 33, which further comprises carrying out the position-determining step by determining a position of a defect area of a multilayer system.

36. A method for repairing an EUV mask, which comprises:
    providing a substrate with a reflective multilayer on top thereof, the substrate having at least one defect beneath or within the multilayer;
    determining a position of a defect area of the substrate in which a phase-shift difference of an exposure radiation is caused by the defect in the defect area; and
    forming a phase-shifting pattern above the multilayer in at least one first portion of the substrate, the first portion at least partially overlapping with the defect area.

37. The EUV mask according to claim 1, wherein the at least one first portion forms a pattern adapted to the defect to reduce the phase-shift difference.

* * * * *